United States Patent
Buse et al.

(10) Patent No.: US 8,111,441 B2
(45) Date of Patent: Feb. 7, 2012

(54) TREATMENT OF CRYSTALS FOR THE PREVENTION OF OPTICAL DAMAGE

(75) Inventors: Karsten Buse, Bonn (DE); Matthias Falk, Los Altos Hills, CA (US); Theo Woike, Euskirchen (DE)

(73) Assignee: Deutsche Telekom AG, Bonn (DE)

( * ) Notice: Subject to any disclaimer, the term of this patent is extended or adjusted under 35 U.S.C. 154(b) by 179 days.

(21) Appl. No.: 12/295,214

(22) PCT Filed: Mar. 15, 2007

(86) PCT No.: PCT/DE2007/000468
§ 371 (c)(1),
(2), (4) Date: Dec. 4, 2009

(87) PCT Pub. No.: WO2007/112719
PCT Pub. Date: Oct. 11, 2007

(65) Prior Publication Data
US 2010/0067087 A1   Mar. 18, 2010

(30) Foreign Application Priority Data
Apr. 6, 2006   (DE) .................. 10 2006 016 201

(51) Int. Cl.
*G02F 1/03* (2006.01)
(52) U.S. Cl. ..................................... 359/245
(58) Field of Classification Search ........... 359/245
See application file for complete search history.

(56) References Cited

U.S. PATENT DOCUMENTS

| 3,932,299 A | 1/1976 | Phillips |
| 5,861,336 A * | 1/1999 | Reedy et al. ............... 438/407 |
| 6,351,411 B2 * | 2/2002 | Forbes et al. .............. 365/182 |
| 6,770,132 B1 | 8/2004 | Burrows |
| 2005/0265916 A1 * | 12/2005 | Jundt et al. ............... 423/594.8 |

FOREIGN PATENT DOCUMENTS
WO   2005068690   7/2005

OTHER PUBLICATIONS

Falk M et al: "Thermo-electric method for nearly complete oxidation of highly iron-doped lithium niobate crystals", Applied Physics B, University of Bonn, Germany, Springer Publishing 2005, Sep. 27, 2005, pp. 853-855.

* cited by examiner

*Primary Examiner* — Joseph P Martinez
(74) *Attorney, Agent, or Firm* — Leydig, Voit & Mayer, Ltd.

(57) ABSTRACT

Method for treating a nominally pure crystal having non-linear optical properties. The nominally pure crystal contain foreign atoms at a residual concentration of less than 20 ppm so as to provide specific absorption of incident light. The method includes determining, based on testing on a specifically doped reference crystal of same type as the nominally pure crystal, a threshold value. The threshold value is defined by a temperature at which a migration of ions in the nominally pure crystal to the surface of the nominally pure crystal ceases. The foreign atoms are transformed to a higher valance state by a thermally-supported oxidation process including heating the nominally pure crystal at a heating rate that increases by less than 3 ° C. per minute to a maximum temperature above the threshold value and below a Curie temperature of the nominally pure crystal. An electrical voltage is applied so as to eliminate electrons released during the oxidation process from the nominally pure crystal.

21 Claims, 3 Drawing Sheets

TREATMENT OF CRYSTALS FOR THE PREVENTION OF OPTICAL DAMAGE

CROSS REFERENCE TO RELATED APPLICATIONS

This application is a U.S. National Phase application under 35 U.S.C. §371 of International Application No. PCT/DE2007/000468, filed on Mar. 15, 2007 and claims benefit to German Patent Application No. DE 10 2006 016 201.3, filed on Apr. 6, 2006. The International Application was published in German on Oct. 11, 2007 as WO 2007/112719 A1 under PCT Article 21(2).

FIELD

The present invention relates to a method for treating a nominally pure crystal which has non-linear optical properties, in particular a lithium niobate crystal or a lithium tantalate crystal, the crystal containing, however, impurities as foreign atoms at a residual concentration of less than 20 ppm, in particular $Fe^{2+}$ ions, which cause specific absorption of incident light, the foreign atoms being transformed into a higher valence state, in particular into $Fe^{3+}$ ions, by means of an oxidation process, supported, for example, by the provision of heat, the electrons released during the oxidation process being eliminated from the crystal by applying an electrical voltage. The present invention also relates to non-linear optical components comprising a crystal treated in this way.

BACKGROUND

Non-linear optical crystals, such as lithium niobate and lithium tantalate, are employed in components for laser optics, for example in frequency doublers or in frequency mixers, it being necessary for the crystal to have a high level of purity for this use. Since it is not possible to avoid a small amount of impurities being contained in the final crystal even when growth is carried out under the purest possible conditions, these crystals are also referred to as "nominally" pure crystals.

The impurities are ions which are present inside the crystal in a plurality of valances and which can act as electron donors and recipients. Its especially problematic for the aforementioned applications is that particularly intense light, especially laser light, can cause the charge of the ions to be redistributed and thus can induce a space-charge field. In electro-optical crystals, the space-charge field causes the refractive index to be modulated in a disruptive manner, and this represents "optical damage" to the light beam insofar as the light beam fans out in the crystal and the quality thereof is therefore lowered.

In this way, iron impurities, which are present in the $Fe^{2+}$ and $Fe^{3+}$ valence states, cause a charge transfer, in which the $Fe^{2+}$ ion releases an electron which enters the conduction band, an $Fe^{3+}$ ion remaining behind and the free electron in the conduction band being captured by the $Fe^{3+}$ ions which are already present. This charge transfer causes serious optical damage. In order to prevent the charge transfer and thus optical damage, attempts have been made to minimise the amount of impurities during the growth stage. However, it has proved to be impossible to date to grow crystals with a residual dopant content of less than 10 ppm.

Another option is to effectively purify the crystal at a later stage, i.e. to render the undesired dopant non-disruptive by oxidising the electron-donating ions, that is to say by converting, for example, the $Fe^{2+}$ ions into the $Fe^{3+}$ state. The thus released surplus electrons are then "washed out" by applying a voltage. Methods of this type are referred to as "oxidation" methods, the purifying effect thereof being supported by high temperatures and external voltages applied to the crystal. In this case, the concentration ratio V of filled to empty impurities serves as a measure for the degree of oxidation; in the case of iron, this is the concentration ratio of $Fe^{2+}$ to $Fe^{3+}$. If V is very low, charge transfer cannot occur since there is a lack of electron donors, and, accordingly, no space-charge field is formed and any optical damage is avoided.

Although the known methods clearly have a purifying effect, the treated crystals are not sufficiently pure for applications using high-intensity laser beams. For this reason it has rarely been possible before now to use known non-linear optical components, such as frequency doublers, frequency mixers or optical parametric oscillators (OPOs) with high-intensity laser beams. The optical damage to which these laser beams are subjected in the components impairs the functionality thereof to an unacceptable extent.

SUMMARY

An aspect of the present invention is to provide an "induced" oxidation process which can be implemented in a simple and cost-effective manner and with which the crystals, in particular lithium niobate and lithium tantalate, can be purified to an extent which has not been achieved to date in such a way that the absorption even of intense radiation in the crystal is reduced to a minimum. Another, alternative aspect of the present invention is to provide non-linear optical components which operate reliably even with a high level of light intensity.

In an embodiment, the present invention provides a method for treating a nominally pure crystal having non-linear optical properties. The nominally pure crystal contain foreign atoms at a residual concentration of less than 20 ppm so as to provide specific absorption of incident light. The method includes determining, based on testing on a specifically doped reference crystal of same type as the nominally pure crystal, a threshold value defined by a temperature at which a migration of ions in the nominally pure crystal to the surface of the nominally pure crystal ceases. The foreign atoms are transformed to a higher valance state by a thermally-supported oxidation process including heating the nominally pure crystal at a heating rate that increases by less than 3° C. per minute to a maximum temperature above the threshold value and below a Curie temperature of the nominally pure crystal. An electrical voltage is applied so as to eliminate electrons released during the oxidation process from the nominally pure crystal.

BRIEF DESCRIPTION OF THE DRAWINGS

The present invention will be described in greater detail on the basis of exemplary embodiments with reference to the figures in which.

DETAILED DESCRIPTION

Figure 1:
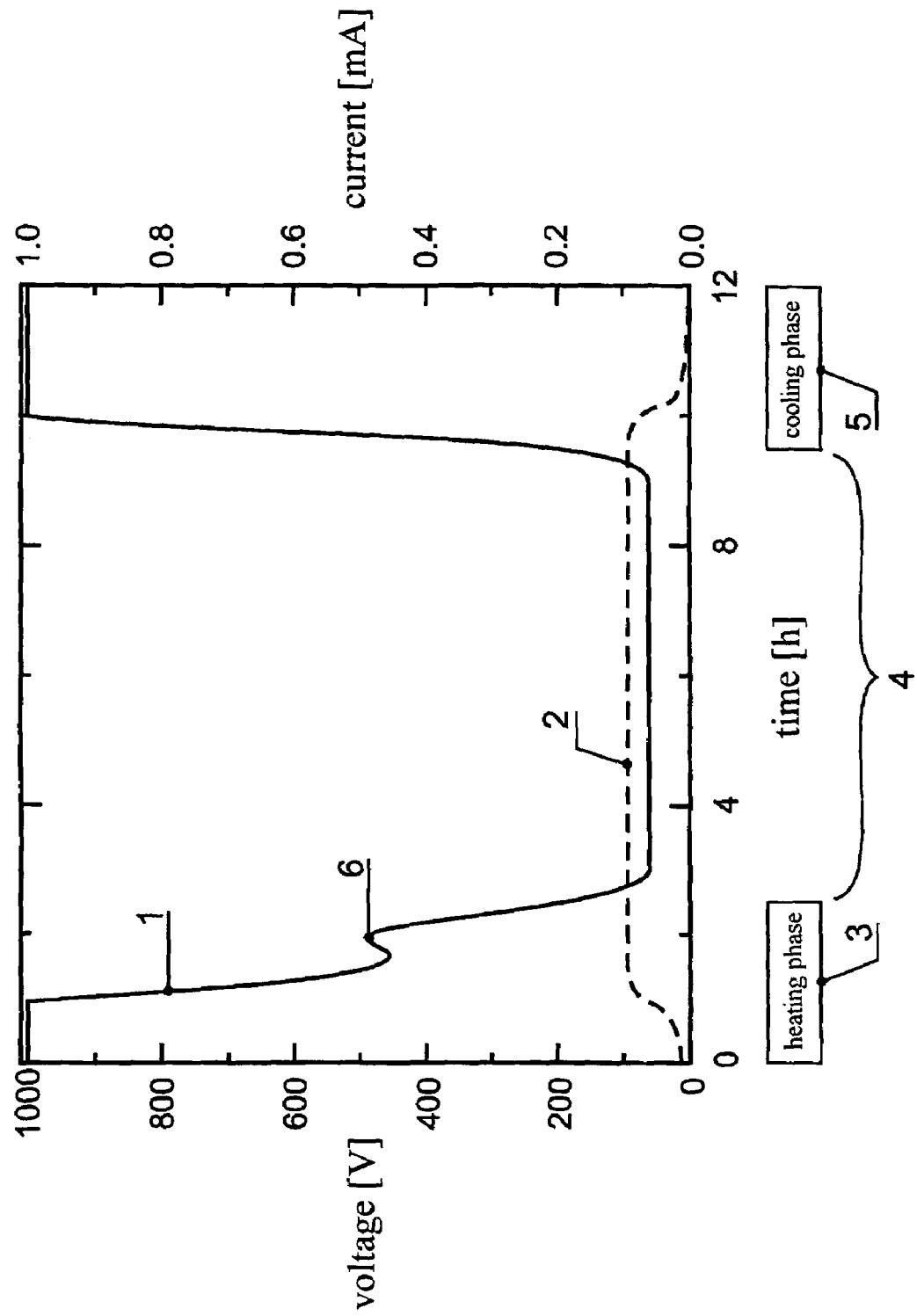
FIG. 1 is a graph showing the relationship between current and voltage during treatment of a crystal.

In an embodiment of the present invention, the crystal is heated slowly, that is to say at a rate that increases by less than 3° C. per minute, in particular by less than 2.5° C. per minute, to a predetermined maximum temperature. In this case, this maximum temperature lies above a predetermined threshold on the one hand and below the Curie temperature of the crystal on the other, which is approximately 1,143° C. for lithium niobate and lithium tantalite. In addition, the threshold, which is dependent on the specific features of the material, lies at the end of a temperature interval which is specific to the crystal and in which the ion migration process occurs and is at least almost completed. Until the threshold is reached, the ions present in the crystal, in particular $Li^+$ ions, migrate to the surface of the crystal due to the applied voltage. An embodiment of the present invention is thus to set the external parameters for the oxidation process, which is induced by temperature and applied voltage, in such a way that ion migration occurs to the greatest possible extent.

It is thus advantageous for the effectiveness of the oxidation process for the temperature to increase continuously and constantly at least within this temperature interval. The ion migration process can be completed at least as far as possible under these conditions. Otherwise there is a danger that the ion migration process might be interrupted.

The rate of temperature increase to be selected is linked to the concentration of foreign atoms and the lower the remaining residual concentration is, the lower the rate of temperature increase should be selected. The temperature increase when oxidising nominally pure crystals should thus not substantially exceed a temperature gradient of 2.5° C. per minute.

Since the conditions which result in as complete an oxidation process as possible, i.e. the parameters to be set during treatment, are material-specific, a further embodiment of the present invention is to propose methods for determining the specific features of the material. The "threshold" parameter is thus determined based on tests on the same type of specifically doped reference crystals. According to the present invention, the threshold and the other parameters determined by using the doped reference crystals are transferred to the nominally pure crystals, the degree of doping of the reference crystals being in particular greater than 0.1% by weight.

In this context, reference is made to the article "Thermoelectric method for nearly complete oxidation of highly iron-doped lithium niobate crystals" by M. Falk and K. Buse in Appl. Phys. Vol. 81, 853-855 (2005), in which a method for oxidising highly doped crystals is described. In this article, the authors speculate (page 855, left column), that the drift of lithium ions plays a role in the charge transfer process required for oxidation. At the end of the article, the authors also mention that it may be possible to purify nominally pure crystals using this thermo-electric oxidation process. However, FIG. 4 of the article suggests that a change in the absorption characteristics of the crystal could not be observed via the absorption spectrum at concentrations of less than 0.05% by weight of $Fe_2O_3$. In addition, there are no known measurement means with which the purifying effect of oxidation can be detected directly on the crystal. Optimisation of the parameters to be set for the method of purifying nominally pure crystals thus cannot be achieved directly on crystals of this type.

The tests carried out in the scope of the present invention demonstrated, however, that the parameters determined for the doped crystals could be transferred to the nominally pure crystals as long as the aforementioned small temperature increases were selected. The method according to the present invention is in principle distinguished by the two following features, select a temperature increase of less than 3° C. per minute and determine the parameters essential for oxidation by using doped reference crystals and use these parameters for the nominally pure crystals. In this case, as previously mentioned, the parameter initially considered to be a parameter is the threshold which is determined by the temperature at which the migration of ions, in particular $Li^+$ ions, in the crystal towards the surface of the crystal is completed. At the end of the migration process, the ions recombine at the surface of the crystal with foreign atom electrons, in particular with the electrons of $Fe^{2+}$ ions, which are then kept as $Fe^{3+}$ ions, or recombine with electrons provided by the power supply.

Further parameters which can be obtained from a reference crystal and transferred to the pure crystal include the voltage to be applied, the flow of current through the crystal, the temperature increase per unit time, the time for which the maximum temperature is maintained, the temperature decrease per unit time, the light wave at length and/or the light intensity.

Experts had previously assumed that oxidation in doped crystals was substantially due to electron migration. Doped crystals contain more available foreign atoms in comparison to pure crystals so the electrons can take the direct route from, for example, $Fe^{2+}$ ions to $Fe^{2+}$ ions. It is, however, difficult to take this route in the case of nominally pure crystals due to the low concentration. The tests have now found, however, that in contrast to the prevailing opinion, ion migration contributes substantially to the purifying effect, even in doped crystals. This result makes it possible, for the first time, to transfer the parameters determined for corresponding reference crystals to the pure crystals, in which electron migration is virtually impossible.

During the charge transfer process, in particular in lithium niobate and lithium tantalate, charge compensation should take place for the electron released by the oxidation process, in this case oxidation from $Fe^{2+}$ to $Fe^{3+}$. According to the results of the tests, an electron is thus captured by a $Li^+$ ion ($Fe^{2+} \rightarrow Fe^{3+}$:$Li^+ + e^- \rightarrow Li^0$) in such a way that neutral lithium forms on the surface of the crystal.

For the oxidation of the pure crystals, the maximum temperature should be maintained at the same level for a specific period of time, advantageously for more than 1 hour and in particular for more than 5 hours, and that after the maximum temperature has been reached and maintained, the crystal is cooled at at least approximately the same gradient of less than 3° C. per minute. As in the heating procedure, it is also advantageous for the rate of temperature change to be less than 2.5° C. per minute while cooling. The voltage source should be switched on during the entire treatment.

In contrast to the known methods, the treatment according to the present invention enables virtually all of the ions which are filled with electrons and could therefore act as charge donors under illumination to be rendered undisruptive by eliminating the electrons which are "disruptive" in terms of optical damage. An advantageous aspect of the method according to the present invention is that it is possible to lower the ratio V by more than a factor of 10 based on the conventional oxidation processes in air or in an oxygen atmosphere, and this increases the robustness of the crystals to optical damage. In this case, the external electric field should be applied not only when the sample is at a constant temperature but also during the particularly long temperature change process.

In order to achieve a level of oxidation which is as complete as possible, it is also advantageous for the crystal to be irradiated, during thermal treatment, with a level of photon energy which is sufficient to raise charges from the impurities and thus to facilitate the elimination of the electrons.

The crystal is therefore advantageously irradiated during thermal treatment with light with a wavelength in the range between UV and green (<550 nm). Using the method according to the present invention demonstrably achieves permanent prevention of, or at least a clear reduction in, optical damage.

Two different methods are initially proposed for the tests to be carried out on the doped crystals in order to determine the parameters. The first method involves an optical test and the second method involves an electrical test of the doped crystal. It has thus been found that, at sufficiently high Fe-doping levels, the crystal becomes transparent during the conversion from $Fe^{2+}$ to $Fe^{3+}$ and that the migration of ions through the crystal, which takes place within the temperature interval, manifests itself as a visible or demonstrable oxidation phase front which moves through the crystal. This movement can be observed and recorded with simple means. The parameters are optimised according to the present invention using the doped crystal in such a way that complete migration takes place, which results in the refractive index or the absorption characteristics of the crystal being changed as homogeneously as possible. The parameters determined in this way are transferred to the treatment of the pure crystals.

The second method for determining the parameters which is to be carried out on the reference crystals involves recording the varying electrical resistance of the crystal during the heating phase, the resistance exhibiting an "anomaly" within the specific temperature interval insofar as said resistance increases during said interval and decreases again when the temperature rises further. The voltage accordingly forms a small peak in the otherwise constantly falling curve. The peak in the current-voltage characteristic curve, which can be observed in doped crystals using conventional measuring devices, indicates an anomaly in the charge transfer process which can be explained by ion migration and the propagation of the oxidation phase front. Since, at the tip of the peak, the oxidation phase front has not yet completely passed through the crystal, the heating ramp must be increased further constantly in such a way that there is sufficient time for the diffusion process to come to an end. Otherwise, the crystal is not completely and homogenously oxidised or the phase front comes to a halt in the crystal. The remaining regions which are not completely oxidised can be identified by faint colouring or by stripes in the otherwise clear crystal. In this respect, the measurement of the peak formed by the electrical resistance during a heating process can be used as an indicator of a successful start to the oxidation process.

It is particularly advantageous if a computer is used when the method according to the present invention is carried out. This computer can record the parameters during the experiment on the reference crystal and/or assume the task of controlling the treatment, i.e. setting the parameters during the treatment.

The pure crystals treated according to the present invention can be used very advantageously in optical components, in particular in non-linear optical components. Using components in which non-linear optical crystals which have been treated according to the present invention are integrated, it is now possible to influence even intense laser light in different ways without "optical damage" impairing the function of said components. In this way, the frequency of incident light can be doubled in a "second harmonic generation" (SHG). In addition, it is possible to mix two frequencies subtractively and additively ("up conversion", "down conversion"). The crystals may furthermore be advantageously used in optical parametric oscillators (OPOs), in which a pump wave with the frequency $\omega_P$ is separated into a signal wave with the frequency $\omega_S$ and in idler wave with the frequency $\omega_I$. These components enable laser light to be generated in a wide range of the electromagnetic spectrum extending from UV, via the visible spectrum, to the infrared range.

The crystal treated according to the present invention is important in that it can maintain a high output intensity in the case of the high input intensities provided by current lasers, it being possible to use both monocrystals and periodically poled crystals in the components. Irrespective of the type of crystal used, the crystal should not affect the pump beam at high laser intensities as the imaging properties of the component would otherwise be lost. A resonator in particular would become unstable. It is advantageous to periodically pole the crystals so the purified crystals are sufficiently efficient for the frequency doubling and frequency mixing procedures (PPLN=periodically poled lithium niobate).

FIG. 1 shows an example of the voltage curve 1 and the current curve 2 of a $LiNbO_3$ crystal doped with 2% by weight of $Fe_2O_3$ during an approximately 3-hour heating phase 3, an approximately 6-hour maintenance phase 4 and an approximately 3-hour cooling phase 5, in a normal air atmosphere and at normal pressure. In the heating phase and the cooling phase, the crystal is subjected to a positive or negative temperature gradient of 3° C. per minute, a maximum temperature of 700° C. being attained. A voltage of 1,000 volts is applied during the entire treatment via electrodes which are attached to the crystal and in which a maximum current of approximately 0.1 mA flows. A current limit of 0.1 mA is set to restrict the current, the applied current being reduced accordingly once the current limit has been exceeded during the heating procedure. The curve shown in FIG. 1 is symmetrical with respect to the heating and cooling phases.

The figure shows that there is a temporary increase in the electrical resistance in the crystal during the heating phase 3. This increase manifests itself as a local peak 6 in the voltage curve after approximately 2 hours. This peak 6 is a result of the elimination of the moveable electrons by means of oxidation. The parameters determined for the doped crystal are used according to the present invention on nominally undoped $LiNbO_3$ crystals which contain iron only as an impurity. In this case, however, the temperature gradient is 2° C. per minute.

The crystal may also be irradiated with light having an intensity $I_A$ and a wavelength $\lambda_A$ for exciting the electrons in the conduction band. The cooperation between the heating rate, the maintained temperature, the time for which the temperature is maintained, cooling rate, current, voltage, intensity and wavelength of the light is important for the oxidation process. These parameters should thus to be adjusted accordingly for each chemical element to be oxidised. Said parameters are specific to the material and also depend on the composition of the ambient atmosphere.

Figure 2:
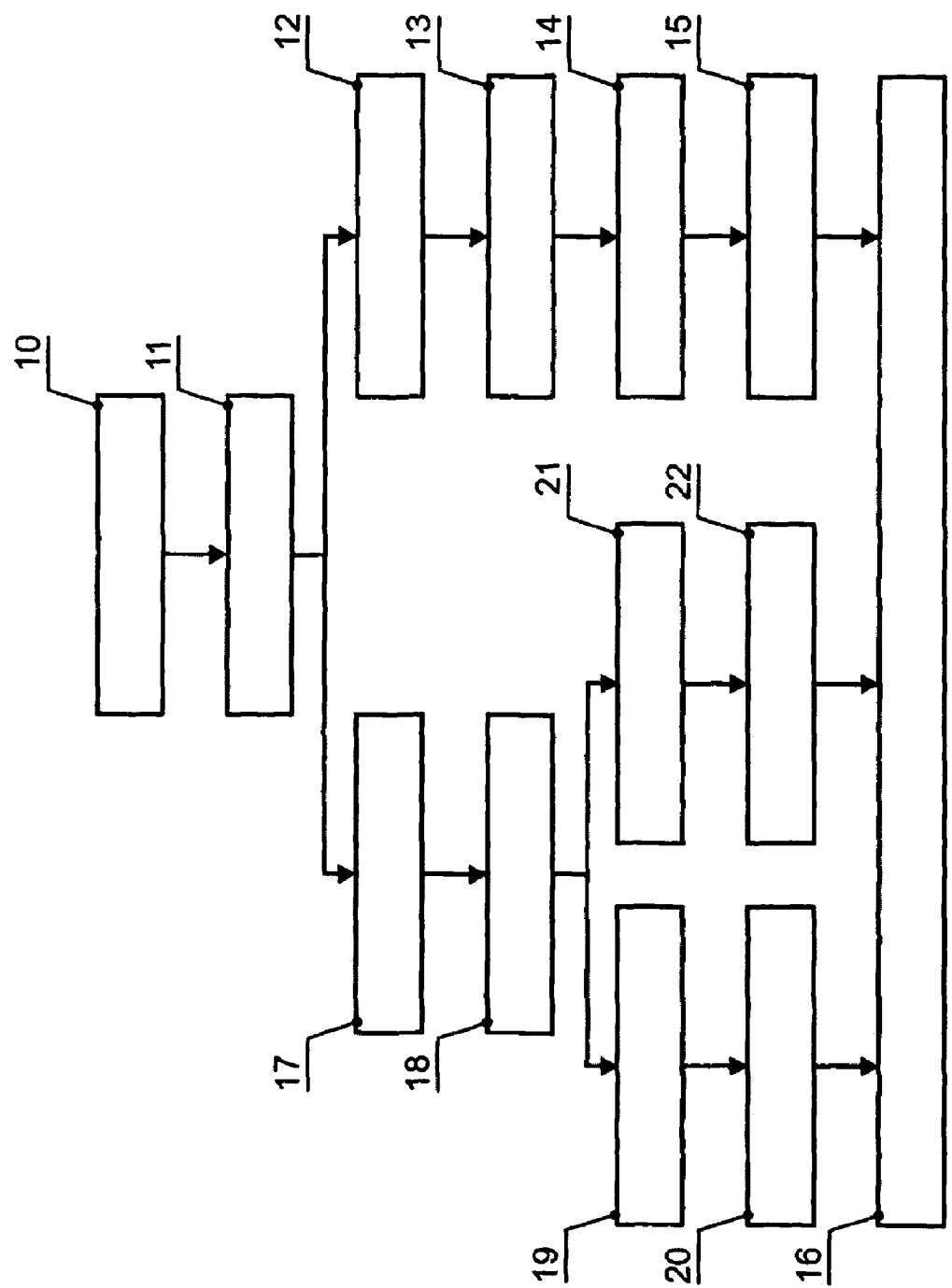
FIG. 2 is an overview of the possible treatment steps.

FIG. 2 shows different developments of a nominally pure crystal from growth to purified PPLN ("periodically poled lithium niobate"). All of the developments begin with the growth 10 of a lithium niobate crystal to form a finished "boule". In step 11, the "boule" is provided with electrodes and is poled at a current flow of approximately 1 µA/cm² in a furnace at a temperature approximately below the Curie temperature. At this point, there are two options for further treatment.

The poled "boule" can be provided whole for the superoxidation purification method according to the present invention (step 12), it being advantageous for the purification process to follow step 11 directly and for the "boule" to remain in the furnace. In this way, the separate steps 11 and 12 are combined to form a common step. In step 13, the "boule" is subsequently cut into wafers which are polished prior to being periodically poled in a lithographic process 14. In step 15, the wafers described are then cut into the individual components, which thus represent finished PPLN crystals 16 without optical damage.

In another processing option, after step 11, the wafers are initially cut and polished (step 17) and the lithographic treatment step 18 is carried out. The individual components may then either be cut to a size of, for example, 15 mm*50 mm (step 19), before these finished components are finally subjected individually to the superoxidation process according to the present invention in step 20. This thus again forms finished PPLN crystals 16 without optical damage. It is also possible, however, to purify the described wafers (step 21) and then to slice them (step 22) after the purification process has been carried out. This then also provides finished PPLN crystals 16. A PPLN crystal of this type with which frequency conversion is possible is shown in FIG. 3.

The use of PPLN crystals in optical components is advantageous for the following reason: the ability to carry out frequency doubling in particular depends on the length of the optical path length in the crystal, and increases to a maximum and then falls to zero again. The crystal must therefore have exactly the optimal thickness or integer multiples thereof. The direction of polarisation in PPLN crystals is set by an external field. The propagation of the light must be perpendicular to this direction of polarisation. When the frequency-doubled light has reached a maximum with regard to the crystal length, a crystal with opposite polarisation is provided for the light beam. At this point, doubling begins again on top of the level already achieved in such a way that further doubled light is produced in addition to the existing doubled light. This effect is repeated from pole to pole. Long periodically-poled crystals, with lengths of between 40 mm and 50 mm in particular, and high laser intensities are used to obtain a high degree of efficiency.

Figure 3:
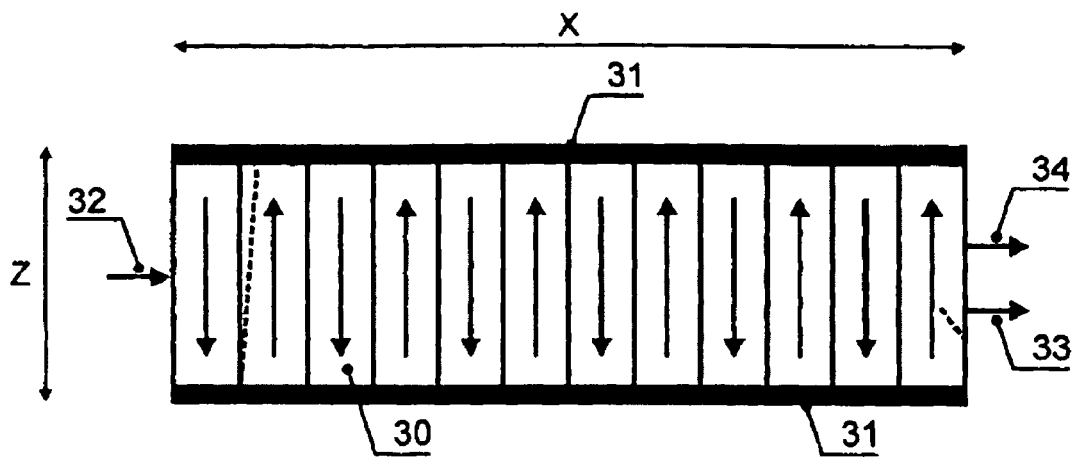
FIG. 3 is a diagram of a frequency converter and FIG. 4 is a schematic diagram of different non-linear optical

The crystal in the frequency converter according to FIG. 3 has a length of 50 mm in the x-direction and a height z of 1 mm The crystal extends to a depth y of 15 mm In this case, twelve polarisation periods in opposite directions are applied to the 50 mm length, the directions being shown in each case by arrows. This means that the crystal has twelve different period lengths in terms of polarisation, i.e. twelve different lengths. The emerging wavelength is varied by control means which alter the external parameters, in particular the temperature of the PPLN crystal. In this way, laser light in the spectral range of approximately 350 nm to 5 µm may be produced with a pump laser with a fixed wavelength by using PPLN.

In this case, an intense laser beam 32 with a frequency in the IR range is beamed into the crystal. IR radiation 33 and blue radiation 34 emerges from the crystal as output radiation. The surfaces of the crystal are still covered with electrodes 31, with which annealing may be carried out. The electrodes 31 may be removed at a later stage.

Figure 4:
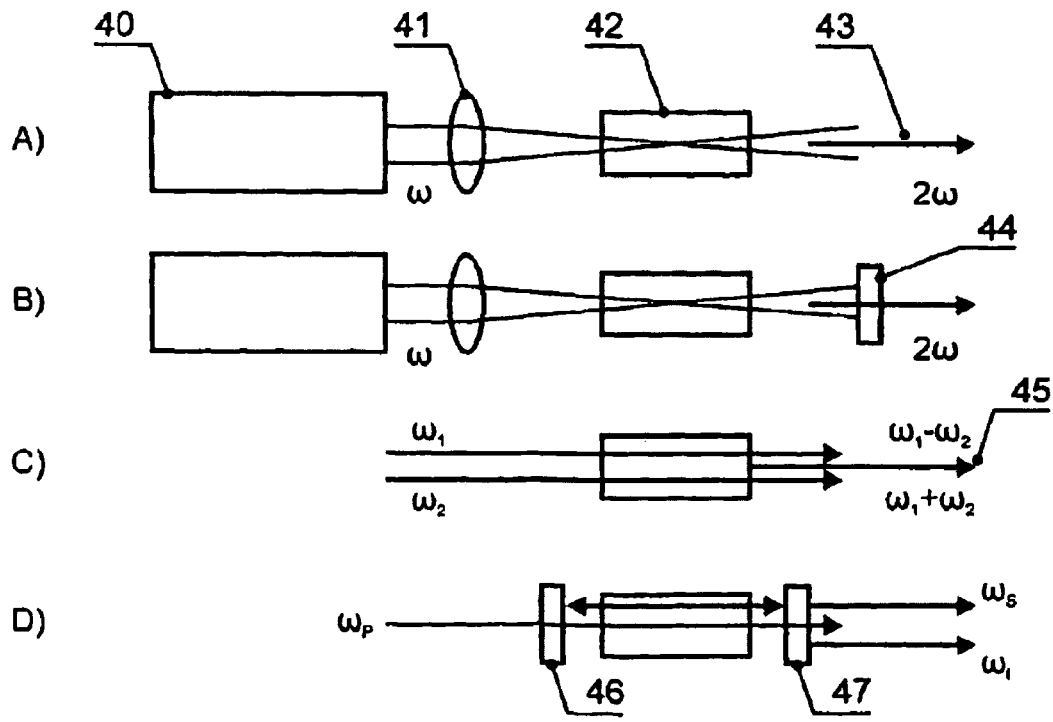

FIG. 4 shows embodiments of non-linear optical components. A pump beam with a frequency ω is generated in each case by a laser 40, for example a single-mode laser diode, a fibre laser or a solid-state laser. If frequency doubling is carried out as in Example A, this pump beam is focussed directly into the PPLN crystal 42 by a lens 41 in such a way that the output radiation 43 comprises the pump radiation with the wavelength ω and the doubled wavelength 2ω.

In Example B, frequency doubling is achieved as a result of the fact that the PPLN crystal 43 treated according to the present invention is located in a resonator. The resonator is composed of the minor of the pump laser and an additional external mirror 44. This minor reflects the pump wavelength almost by 100% in such a way that only the doubled light 2ω emerges. This arrangement enables higher output intensities and improved intensity stability to be achieved.

Example C shows sum or difference frequency mixing when two waves with different frequencies ω1 and ω2 enter the crystal. Passing through the crystal once produces a beam 45 with a frequency ω1−ω2 or ω1+ω2, the pump beams ω1 and ω2 being retained.

Example D shows an optical parametric oscillator. For this purpose, the PPLN crystal is located in an external resonator between two mirrors 46 and 47 and is illuminated by the light with the pump frequency $\omega_P$. Two new waves with the signal frequency $\omega_S$ and an idler frequency $\omega_I$ are formed in the resonator, $\omega_P$ being equal to $\omega_S+\omega_I$.

The invention claimed is:

1. Method for treating a nominally pure crystal having non-linear optical properties, the nominally pure crystal containing foreign atoms at a residual concentration of less than 20 ppm so as to provide specific absorption of incident light, the method comprising:
   determining, based on testing on a specifically doped reference crystal of same type as the nominally pure crystal, a threshold value defined by a temperature at which a migration of ions in the nominally pure crystal to the surface of the nominally pure crystal ceases;
   transforming the foreign atoms to a higher valance state by a thermally-supported oxidation process including heating the nominally pure crystal at a heating rate that increases by less than 2.5° C. per minute to a maximum temperature above the threshold value and below a Curie temperature of the nominally pure crystal; and
   applying an electrical voltage so as to eliminate electrons released during the oxidation process from the nominally pure crystal.

2. Method as recited in claim 1, wherein the nominally pure crystal is a lithium niobate crystal or a lithium tantalate crystal.

3. Method as recited in claim 1, wherein the foreign atoms are $Fe^{2+}$ ions and the higher valance state ions to which the foreign atoms are transformed are $Fe^{3+}$ ions.

4. Method as recited in claim 1, wherein the threshold value lies at an end of a specific temperature interval within which the migration of ions occurs, the temperature being increased continually and constantly during the specific temperature interval.

5. Method as recited in claim 1, further comprising determining further parameters for the thermally-supported oxidation process in addition to the threshold value using the specifically doped reference crystal, and wherein at least one of the transforming and the applying is performed based on the further parameters.

6. Method as recited in claim 5, wherein the further parameters include at least one of a voltage to be supplied, a current flow through the crystal, the heating rate, the time for which the maximum temperature is maintained, a temperature decrease per unit time, a light wavelength, and a light intensity.

7. Method as recited in claim 1, wherein the specifically doped reference crystal is a crystal doped with a concentration of more than 0.1% by weight of the foreign atoms.

8. Method as recited in claim 1, wherein during the testing, at least one of a change in a refractive index and a change in absorption characteristics of the specifically doped reference crystal is recorded, the change moving through the specifically doped reference crystal as a visible or portrayable front during a temperature interval.

9. Method as recited in claim 1, wherein during the testing, a changing resistance in the specifically doped reference crystal during a heating phase is recorded, an electrical resistance increasing within a specific temperature interval and falling again as the temperature increases further.

10. Method as recited in claim 1, wherein the maximum temperature is maintained for more than 1 hour.

11. Method as recited in claim 1, wherein the maximum temperature is maintained for more than 5 hours.

12. Method as recited in claim 1, further comprising cooling the nominally pure crystal, after the maximum temperature has been reached and maintained, at a cooling rate of approximately less than 3° C. per minute while a voltage source of the electrical voltage remains switched on.

13. Method as recited in claim 1, further comprising cooling the nominally pure crystal, and wherein a rate of the heating and cooling is less than 2.5° C. per minute.

14. Method as recited in claim 1, further comprising irradiating the nominally pure crystal with light having a wavelength in the range between UV and green (<550 nm) during the thermally-supported oxidation process.

15. Method as recited in claim 1, wherein the testing on the specifically doped reference crystals is carried out automatically using a computer.

16. Method as recited in claim 1, wherein a computer sets parameters of at least one of the transforming and the applying automatically.

17. Oxidic non-linear optical crystal treated by the method recited in claim 1.

18. The crystal as recited in claim 17, wherein the crystal has a plurality of regions, each region having a direction of applied polarization, a respective direction of the applied polarization of adjacent regions of the plurality of regions being opposite in a manner of a periodically poled lithium niobate.

19. System comprising a crystal as recited in claim 17, wherein parameters acting on the crystal are adjustable so as to double a frequency of a laser beam beamed into the crystal.

20. System comprising a crystal as recited in claim 17, wherein parameters acting on the crystal are adjustable so as to mix two or more frequencies beamed into the crystal.

21. System comprising a crystal as recited in claim 17, wherein parameters acting on the crystal are adjustable so as to provide an optical parametric oscillator.

* * * * *